(12) United States Patent  (10) Patent No.: US 8,981,568 B2
Rathburn  (45) Date of Patent: Mar. 17, 2015

(54) SIMULATED WIREBOND SEMICONDUCTOR PACKAGE

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 192 days.

(21) Appl. No.: 13/319,120

(22) PCT Filed: Jun. 7, 2010

(86) PCT No.: PCT/US2010/037619
§ 371 (c)(1),
(2), (4) Date: Nov. 7, 2011

(87) PCT Pub. No.: WO2010/147782
PCT Pub. Date: Dec. 23, 2010

(65) Prior Publication Data
US 2012/0061851 A1    Mar. 15, 2012

Related U.S. Application Data

(60) Provisional application No. 61/187,506, filed on Jun. 16, 2009.

(51) Int. Cl.
*H01L 23/48* (2006.01)
*H01L 23/00* (2006.01)
(Continued)

(52) U.S. Cl.
CPC .............. *H01L 24/50* (2013.01); *B23K 1/0016* (2013.01); *B23K 20/004* (2013.01);
(Continued)

(58) Field of Classification Search
CPC ............. H01L 2224/97; H01L 2224/73265; H01L 2224/48227; H01L 21/4857; H01L 2924/15184

USPC ........... 257/E21.511, E23.066, E23.178, 774, 257/E21.502; 438/215
See application file for complete search history.

(56) References Cited

U.S. PATENT DOCUMENTS 3,672,986 A  6/1972 Schneble, Jr. et al.
4,188,438 A  2/1980 Burns
(Continued)

FOREIGN PATENT DOCUMENTS

JP  2003/217774  7/2003
WO  WO 91/14015  9/1991
(Continued)

OTHER PUBLICATIONS

Liu, et al, "All-Polymer Capacitor Fabricated with Inkjet Printing Technique," Solid-State Electronics, vol. 47, pp. 1543-1548 (2003).
(Continued)

*Primary Examiner* — Stephen W Smoot
*Assistant Examiner* — Edward Chin
(74) *Attorney, Agent, or Firm* — Stoel Rives LLP

(57) ABSTRACT

A semiconductor package with simulated wirebonds. A substrate is provided with a plurality of first pads on a first surface and a plurality of second pads on a second surface. Each of the first pads are electrically coupled to one or more of the second pads. At least one semiconductor device is located proximate the first surface of a substrate. The simulated wirebonds include at least a first dielectric layer selectively printed to create a plurality of recesses, and a conductive material located in the recesses to form first and second contact pads, and electrical traces electrically coupling the first and second contact pads. The first contact pads are electrically coupled to terminals on the semiconductor device and the second contact pads are electrically coupled to the first pads on the first surface of the substrate. An overmolding material seals the semiconductor device and the simulated wirebonds.

20 Claims, 16 Drawing Sheets

(51) Int. Cl.
  *B23K 1/00* (2006.01)
  *B23K 20/00* (2006.01)
  *H01L 21/683* (2006.01)
  *H01L 23/552* (2006.01)
  *H01L 25/065* (2006.01)
  *H01L 23/31* (2006.01)

(52) U.S. Cl.
  CPC .......... *H01L 21/6835* (2013.01); *H01L 23/48* (2013.01); *H01L 23/552* (2013.01); *H01L 24/86* (2013.01); *H01L 25/0655* (2013.01); *H01L 25/0657* (2013.01); *B23K 2201/42* (2013.01); *H01L 23/3107* (2013.01); *H01L 2223/6677* (2013.01); *H01L 2924/01004* (2013.01); *H01L 2924/01013* (2013.01); *H01L 2924/01015* (2013.01); *H01L 2924/01029* (2013.01); *H01L 2924/01046* (2013.01); *H01L 2924/01049* (2013.01); *H01L 2924/01075* (2013.01); *H01L 2924/01078* (2013.01); *H01L 2924/01079* (2013.01); *H01L 2924/01082* (2013.01); *H01L 2924/09701* (2013.01); *H01L 2924/12044* (2013.01); *H01L 2924/14* (2013.01); *H01L 2924/19041* (2013.01); *H01L 2924/19042* (2013.01); *H01L 2924/19043* (2013.01); *H01L 2924/30107* (2013.01); *H01L 2924/3011* (2013.01); *H01L 2924/3025* (2013.01); *H01L 2924/01005* (2013.01); *H01L 2924/01006* (2013.01); *H01L 2924/01033* (2013.01); *H01L 2924/01047* (2013.01); *H01L 2924/014* (2013.01); *H01L 2225/06524* (2013.01); *H01L 2225/06568* (2013.01)
  USPC .................. 257/774; 257/777; 257/E23.011; 257/E21.504; 438/107; 438/127

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A | 10/1990 | Reed | |
| 5,014,159 A | 5/1991 | Butt | |
| 5,072,520 A | 12/1991 | Nelson | |
| 5,127,837 A | 7/1992 | Shah et al. | |
| 5,129,573 A | 7/1992 | Duffey | |
| 5,161,983 A | 11/1992 | Ohno | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,674,595 A | 10/1997 | Busacco et al. | |
| 5,691,041 A | 11/1997 | Frankeny et al. | |
| 5,716,663 A | 2/1998 | Capote et al. | |
| 5,741,624 A | 4/1998 | Jeng et al. | |
| 5,746,608 A | 5/1998 | Taylor | |
| 5,761,801 A | 6/1998 | Gebhardt et al. | |
| 5,791,911 A | 8/1998 | Fasano et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,925,931 A | 7/1999 | Yamamoto | |
| 5,933,558 A | 8/1999 | Sauvageau et al. | |
| 6,020,597 A | 2/2000 | Kwak | |
| 6,062,879 A | 5/2000 | Beaman et al. | |
| 6,080,932 A | 6/2000 | Smith et al. | |
| 6,118,426 A | 9/2000 | Albert | |
| 6,120,588 A | 9/2000 | Jacobson | |
| 6,137,687 A | 10/2000 | Shirai et al. | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,225,692 B1* | 5/2001 | Hinds | 257/698 |
| 6,247,938 B1 | 6/2001 | Rathburn | |
| 6,252,564 B1 | 6/2001 | Albert | |
| 6,255,126 B1 | 7/2001 | Mathieu et al. | |
| 6,263,566 B1 | 7/2001 | Hembree et al. | |
| 6,270,363 B1 | 8/2001 | Brofman et al. | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,437,452 B2 | 8/2002 | Lin | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,477,286 B1 | 11/2002 | Ouchi | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,662,442 B1 | 12/2003 | Matsui et al. | |
| 6,709,967 B2* | 3/2004 | Evers | 438/617 |
| 6,744,126 B1 | 6/2004 | Chiang | |
| 6,750,473 B2 | 6/2004 | Amundson | |
| 6,750,551 B1 | 6/2004 | Frutschy et al. | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,962,829 B2 | 11/2005 | Glenn et al. | |
| 6,965,168 B2* | 11/2005 | Langhorn | 257/778 |
| 6,967,640 B2 | 11/2005 | Albert | |
| 6,971,902 B2 | 12/2005 | Taylor | |
| 6,987,661 B1 | 1/2006 | Huemoeller et al. | |
| 6,992,376 B2 | 1/2006 | Jaeck | |
| 7,009,413 B1 | 3/2006 | Alghouli | |
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,064,412 B2 | 6/2006 | Geissinger et al. | |
| 7,095,090 B2 | 8/2006 | Nakajima et al. | |
| 7,101,210 B2 | 9/2006 | Lin | |
| 7,114,960 B2 | 10/2006 | Rathburn | |
| 7,118,391 B2 | 10/2006 | Minich et al. | |
| 7,121,837 B2 | 10/2006 | Sato et al. | |
| 7,121,839 B2 | 10/2006 | Rathburn | |

(56) References Cited

U.S. PATENT DOCUMENTS

| | | | |
|---|---|---|---|
| 7,129,166 B2 | 10/2006 | Speakman | |
| 7,138,328 B2 * | 11/2006 | Downey et al. | 438/617 |
| 7,145,228 B2 | 12/2006 | Yean et al. | |
| 7,148,128 B2 | 12/2006 | Jacobson | |
| 7,154,175 B2 | 12/2006 | Shrivastava et al. | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,244,967 B2 | 7/2007 | Hundt et al. | |
| 7,249,954 B2 | 7/2007 | Weiss | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,337,537 B1 | 3/2008 | Smetana, Jr. | |
| 7,382,363 B2 | 6/2008 | Albert et al. | |
| 7,402,515 B2 | 7/2008 | Arana et al. | |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,422,439 B2 | 9/2008 | Rathburn et al. | |
| 7,423,219 B2 | 9/2008 | Kawaguchi et al. | |
| 7,427,717 B2 | 9/2008 | Morimoto et al. | |
| 7,432,600 B2 | 10/2008 | Klein et al. | |
| 7,458,150 B2 | 12/2008 | Totokawa et al. | |
| 7,459,393 B2 | 12/2008 | Farnworth et al. | |
| 7,485,345 B2 | 2/2009 | Renn | |
| 7,508,076 B2 | 3/2009 | Japp et al. | |
| 7,527,502 B2 | 5/2009 | Li | |
| 7,537,461 B2 | 5/2009 | Rathburn | |
| 7,538,415 B1 | 5/2009 | Lin et al. | |
| 7,548,430 B1 | 6/2009 | Huemoeller et al. | |
| 7,563,645 B2 | 7/2009 | Jaeck | |
| 7,595,454 B2 | 9/2009 | Kresge et al. | |
| 7,619,309 B2 | 11/2009 | Drexl et al. | |
| 7,621,761 B2 | 11/2009 | Mok et al. | |
| 7,632,106 B2 | 12/2009 | Nakamura | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,748,110 B2 | 7/2010 | Asahi et al. | |
| 7,800,916 B2 | 9/2010 | Blackwell et al. | |
| 7,833,832 B2 | 11/2010 | Wood et al. | |
| 7,897,503 B2 | 3/2011 | Foster et al. | |
| 7,898,087 B2 | 3/2011 | Chainer | |
| 7,999,369 B2 | 8/2011 | Malhan et al. | |
| 8,072,058 B2 | 12/2011 | Kim et al. | |
| 8,120,173 B2 | 2/2012 | Forman et al. | |
| 8,148,643 B2 | 4/2012 | Hirose et al. | |
| 8,154,119 B2 | 4/2012 | Yoon et al. | |
| 8,158,503 B2 | 4/2012 | Abe | |
| 8,159,824 B2 | 4/2012 | Cho et al. | |
| 8,178,978 B2 | 5/2012 | McElrea et al. | |
| 8,227,703 B2 | 7/2012 | Maruyama et al. | |
| 8,232,632 B2 | 7/2012 | Rathburn | |
| 8,278,141 B2 | 10/2012 | Chow et al. | |
| 8,299,494 B2 | 10/2012 | Yilmaz et al. | |
| 8,329,581 B2 * | 12/2012 | Haba et al. | 438/669 |
| 8,344,516 B2 | 1/2013 | Chainer | |
| 8,373,428 B2 | 2/2013 | Eldridge et al. | |
| 8,421,151 B2 | 4/2013 | Yamashita | |
| 8,525,346 B2 | 9/2013 | Rathburn | |
| 8,536,714 B2 | 9/2013 | Sakaguchi | |
| 8,610,265 B2 | 12/2013 | Rathburn | |
| 8,618,649 B2 | 12/2013 | Rathburn | |
| 8,758,067 B2 | 6/2014 | Rathburn | |
| 8,789,272 B2 | 7/2014 | Rathburn | |
| 8,803,539 B2 | 8/2014 | Rathburn | |
| 8,829,671 B2 | 9/2014 | Rathburn | |
| 2001/0012707 A1 | 8/2001 | Ho et al. | |
| 2001/0016551 A1 | 8/2001 | Yishio et al. | |
| 2002/0011639 A1 | 1/2002 | Carlson et al. | |
| 2002/0027441 A1 | 3/2002 | Akram et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0188890 A1 | 10/2003 | Bhatt et al. | |
| 2003/0189083 A1 | 10/2003 | Olsen | |
| 2004/0016995 A1 * | 1/2004 | Kuo et al. | 257/678 |
| 2004/0029411 A1 * | 2/2004 | Rathburn | 439/66 |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0048680 A1 * | 3/2005 | Matsunami | 438/21 |
| 2005/0100294 A1 * | 5/2005 | Nguyen et al. | 385/92 |
| 2005/0101164 A1 | 5/2005 | Rathburn | |
| 2005/0164527 A1 | 7/2005 | Radza et al. | |
| 2006/0001152 A1 | 1/2006 | Hu | |
| 2006/0006534 A1 | 1/2006 | Yean et al. | |
| 2006/0012966 A1 | 1/2006 | Chakravorty | |
| 2006/0024924 A1 | 2/2006 | Haji et al. | |
| 2006/0044357 A1 | 3/2006 | Andersen et al. | |
| 2006/0087064 A1 | 4/2006 | Daniel et al. | |
| 2006/0149491 A1 | 7/2006 | Flach et al. | |
| 2006/0157103 A1 | 7/2006 | Sheats et al. | |
| 2006/0160379 A1 | 7/2006 | Rathburn | |
| 2006/0186906 A1 | 8/2006 | Bottoms et al. | |
| 2006/0208230 A1 | 9/2006 | Cho et al. | |
| 2006/0258912 A1 | 11/2006 | Belson et al. | |
| 2006/0261827 A1 | 11/2006 | Cooper et al. | |
| 2007/0021002 A1 | 1/2007 | Laurx et al. | |
| 2007/0145981 A1 | 6/2007 | Tomita et al. | |
| 2007/0148822 A1 | 6/2007 | Haba et al. | |
| 2007/0170595 A1 | 7/2007 | Sinha | |
| 2007/0221404 A1 | 9/2007 | Das et al. | |
| 2007/0224735 A1 | 9/2007 | Karashima et al. | |
| 2007/0232059 A1 | 10/2007 | Abe | |
| 2007/0259539 A1 | 11/2007 | Brown et al. | |
| 2007/0269999 A1 | 11/2007 | Di Stefano | |
| 2007/0273394 A1 | 11/2007 | Tanner et al. | |
| 2007/0289127 A1 | 12/2007 | Hurwitz et al. | |
| 2007/0296090 A1 | 12/2007 | Hembree | |
| 2008/0008822 A1 | 1/2008 | Kowalski | |
| 2008/0020566 A1 | 1/2008 | Egitto et al. | |
| 2008/0041822 A1 | 2/2008 | Wang | |
| 2008/0057753 A1 | 3/2008 | Rathburn et al. | |
| 2008/0060838 A1 | 3/2008 | Chen et al. | |
| 2008/0073110 A1 | 3/2008 | Shioga et al. | |
| 2008/0093115 A1 | 4/2008 | Lee | |
| 2008/0143358 A1 | 6/2008 | Breinlinger | |
| 2008/0143367 A1 | 6/2008 | Chabineau-Lovgren | |
| 2008/0156856 A1 | 7/2008 | Laurx | |
| 2008/0157361 A1 | 7/2008 | Wood et al. | |
| 2008/0182436 A1 | 7/2008 | Rathburn | |
| 2008/0185180 A1 | 8/2008 | Cheng et al. | |
| 2008/0197867 A1 | 8/2008 | Wokhlu et al. | |
| 2008/0220584 A1 | 9/2008 | Kim et al. | |
| 2008/0241997 A1 | 10/2008 | Sunohara et al. | |
| 2008/0246136 A1 | 10/2008 | Haba et al. | |
| 2008/0248596 A1 | 10/2008 | Das et al. | |
| 2008/0250363 A1 | 10/2008 | Goto et al. | |
| 2008/0265919 A1 | 10/2008 | Izadian | |
| 2008/0290885 A1 | 11/2008 | Matsunami | |
| 2008/0309349 A1 | 12/2008 | Sutono | |
| 2009/0039496 A1 | 2/2009 | Beer et al. | |
| 2009/0058444 A1 | 3/2009 | McIntyre | |

(56) References Cited

U.S. PATENT DOCUMENTS

| | | | |
|---|---|---|---|
| 2009/0061089 | A1 | 3/2009 | King |
| 2009/0065918 | A1 | 3/2009 | Murphy |
| 2009/0127698 | A1 | 5/2009 | Rathburn |
| 2009/0133906 | A1 | 5/2009 | Baek |
| 2009/0224404 | A1 | 9/2009 | Wood et al. |
| 2009/0241332 | A1 | 10/2009 | Lauffer et al. |
| 2009/0267628 | A1 | 10/2009 | Takase |
| 2009/0321915 | A1 | 12/2009 | Hu et al. |
| 2010/0022105 | A1 | 1/2010 | Di Stefano |
| 2010/0133680 | A1 | 6/2010 | Kang et al. |
| 2010/0213960 | A1 | 8/2010 | Mok et al. |
| 2011/0101540 | A1 | 5/2011 | Chainer |
| 2012/0017437 | A1 | 1/2012 | Das et al. |
| 2012/0043119 | A1 | 2/2012 | Rathburn |
| 2012/0043130 | A1 | 2/2012 | Rathburn |
| 2012/0043667 | A1 | 2/2012 | Rathburn |
| 2012/0044659 | A1 | 2/2012 | Rathburn |
| 2012/0049342 | A1 | 3/2012 | Rathburn |
| 2012/0049877 | A1 | 3/2012 | Rathburn |
| 2012/0051016 | A1 | 3/2012 | Rathburn |
| 2012/0055701 | A1 | 3/2012 | Rathburn |
| 2012/0055702 | A1 | 3/2012 | Rathburn |
| 2012/0056332 | A1 | 3/2012 | Rathburn |
| 2012/0056640 | A1 | 3/2012 | Rathburn |
| 2012/0058653 | A1 | 3/2012 | Rathburn |
| 2012/0061846 | A1 | 3/2012 | Rathburn |
| 2012/0062270 | A1 | 3/2012 | Rathburn |
| 2012/0068727 | A1 | 3/2012 | Rathburn |
| 2012/0161317 | A1 | 6/2012 | Rathburn |
| 2012/0164888 | A1 | 6/2012 | Rathburn |
| 2012/0168948 | A1 | 7/2012 | Rathburn |
| 2012/0171907 | A1 | 7/2012 | Rathburn |
| 2012/0182035 | A1 | 7/2012 | Rathburn |
| 2012/0199985 | A1 | 8/2012 | Rathburn |
| 2012/0202364 | A1 | 8/2012 | Rathburn |
| 2012/0244728 | A1 | 9/2012 | Rathburn |
| 2012/0252164 | A1 | 10/2012 | Nakao et al. |
| 2012/0257343 | A1 | 10/2012 | Das et al. |
| 2012/0268155 | A1 | 10/2012 | Rathburn |
| 2013/0078860 | A1 | 3/2013 | Rathburn |
| 2013/0105984 | A1 | 5/2013 | Rathburn |
| 2013/0203273 | A1 | 8/2013 | Rathburn |
| 2013/0206468 | A1 | 8/2013 | Rathburn |
| 2013/0210276 | A1 | 8/2013 | Rathburn |
| 2013/0223034 | A1 | 8/2013 | Rathburn |
| 2013/0244490 | A1 | 9/2013 | Rathburn |
| 2013/0330942 | A1 | 12/2013 | Rathburn |
| 2014/0043782 | A1 | 2/2014 | Rathburn |
| 2014/0080258 | A1 | 3/2014 | Rathburn |
| 2014/0192498 | A1 | 7/2014 | Rathburn |
| 2014/0220797 | A1 | 8/2014 | Rathburn |
| 2014/0225255 | A1 | 8/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |
| WO | WO-2014/011226 | 1/2014 |
| WO | WO-2014/011228 | 1/2014 |
| WO | WO-2014/011232 | 1/2014 |

OTHER PUBLICATIONS

Notification of Transmittal of the International Search Report and the Written Opinion of the International Searching Authority mailed Jun. 7, 2013 in International Application No. PCT/US2013/030856.

Notification of Transmittal of the International Search Report and the Written Opinion of the International Searching Authority mailed Jun. 19, 2013 in International Application No. PCT/US2013/030981.

Notification of Transmittal of the International Search Report and the Written Opinion of the International Searching Authority mailed Jun. 3, 2013 in International Application No. PCT/US2013/031395.

Restriction Requirement mailed Jun. 13, 2013 in co-pending U.S. Appl. No. 13/266,486, now published as US Patent Application Publication No. US 2012/0055701.

Office Communication mailed May 30, 2013 in co-pending U.S. Appl. No. 13/318,200, now published as US Patent Application Publication No. US 2012/0056332.

Office Action mailed May 30, 2013 in co-pending U.S. Appl. No. 13/318,200, now published as US Patent Application Publication No. US 2012/0056332.

Amendment and Response filed Jul. 1, 2013 in co-pending U.S. Appl No. 13/318,200, now published as US Patent Application Publication No. US 2012/0056332.

Examiner-Initiated Interview Summary mailed Mar. 14, 2013 in co-pending U.S. Appl. No. 13/319,228, now published as US Patent Application Publication No. US 2012/0058653.

Office Action mailed Apr. 30, 2013 in co-pending U.S. Appl. No. 13/413,724, now published as US Patent Application Publication No. US 2012/0168948.

Amendment and Response filed May 7, 2013 in co-pending U.S. Appl. No. 13/413,724, now published as US Patent Application Publication No. US 2012/0168948.

Notice of Non-Compliant Amendment mailed May 16, 2013 in co-pending U.S. Appl. No. 13/413,724, now published as US Patent Application Publication No. US 2012/0168948.

Revised Amendment and Response filed May 17, 2013 in co-pending U.S. Appl. No. 13/413,724, now published as US Patent Application Publication No. US 2012/0168948.

Office Action mailed May 9, 2013 in co-pending U.S. Appl. No. 13/448,914, now published as US Patent Application Publication No. US 2012/0202364.

Amendment and Response filed May 20, 2013 in co-pending U.S. Appl. No. 13/448,914, now published as US Patent Application Publication No. US 2012/0202364.

Co-pending U.S. Appl. No. 13/575,368, titled High Speed Backplane Connector, filed Jul. 26, 2012.

Response to Restriction Requirement filed Jul. 15, 2013 in co-pending U.S. Appl. No. 13/266,486, now published as US Patent Application Publication No. US 2012/0055701.

Restriction Requirement mailed Sep. 25, 2013 in co-pending U.S. Appl. No. 13/266,486, now published as US Patent Application Publication No. US 2012/0055701.

Response to Restriction Requirement filed Oct. 2, 2013 in copending U.S. Appl. No. 13/266,486, now published as US Patent Application Publication No. US 2012/0055701.

Office Action mailed Jul. 10, 2013 in co-pending U.S. Appl. No. 13/318,263, now published as US Patent Application Publication No. US 2012/0043667.

(56) References Cited

OTHER PUBLICATIONS

Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Authority issued Sep. 27, 2011 in International Application No. PCT/US2011/038845.
Co-pending U.S. Appl. No. 13/266,486 titled High Performance Surface Mount electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.

(56) References Cited

OTHER PUBLICATIONS

Co-pending U.S. Appl. No. 13/880,461 titled Electrical Interconnect IC Device Socket, filed Apr. 19, 2013.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.

(56) References Cited

OTHER PUBLICATIONS

Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Final Office Action mailed May 15, 2014 in co-pending U.S. Appl. No. 13/266,486, now published as US Patent Application Publication No. US 2012/0055701.
Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement field Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Amendment and Response and Terminal Disclaimer filed Apr. 2, 2014 in co-pending U.S. Appl. No. 13/318,038, now published as US Patent Application Publication No. US 2012/0062270.
Terminal Disclaimer Review Decision mailed Apr. 2, 2014 in co-pending U.S. Appl. No. 13/318,038, now published as US Patent Application Publication No. US 2012/0062270.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.

(56) References Cited

OTHER PUBLICATIONS

Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Final Office Action mailed Aug. 1, 2014 in co-pending U.S. Appl. No. 13/318,038, now published as US Patent Application Publication No. US 2012/0062270.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.

* cited by examiner

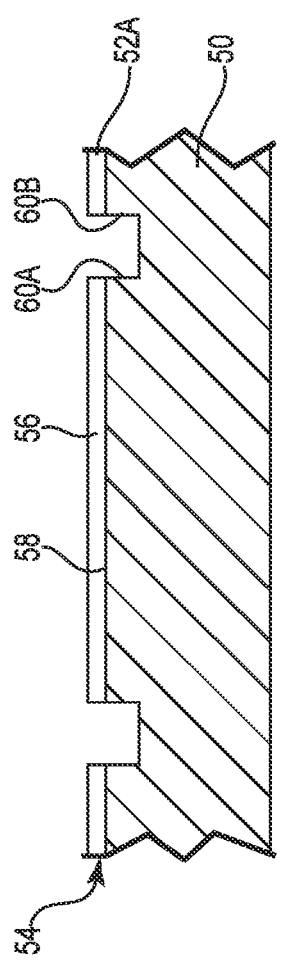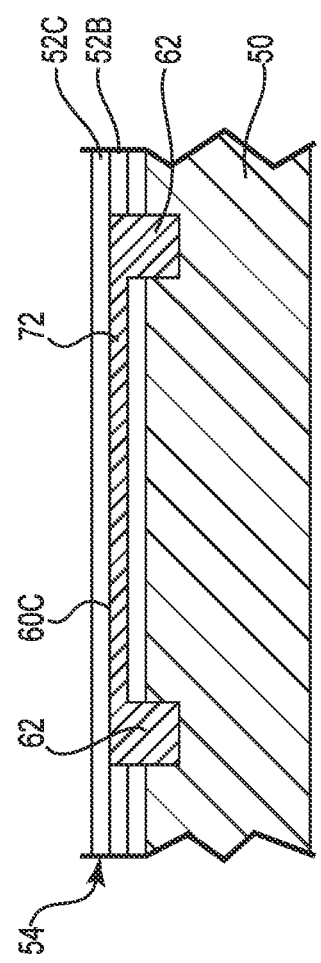

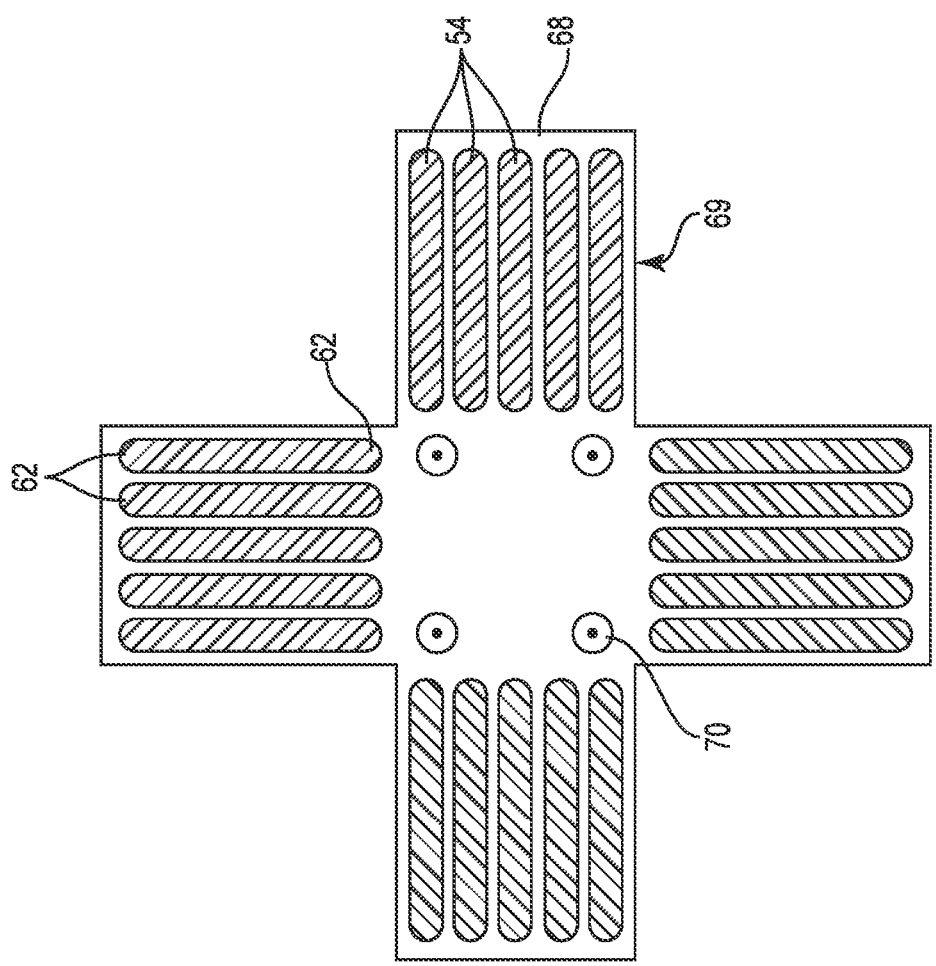

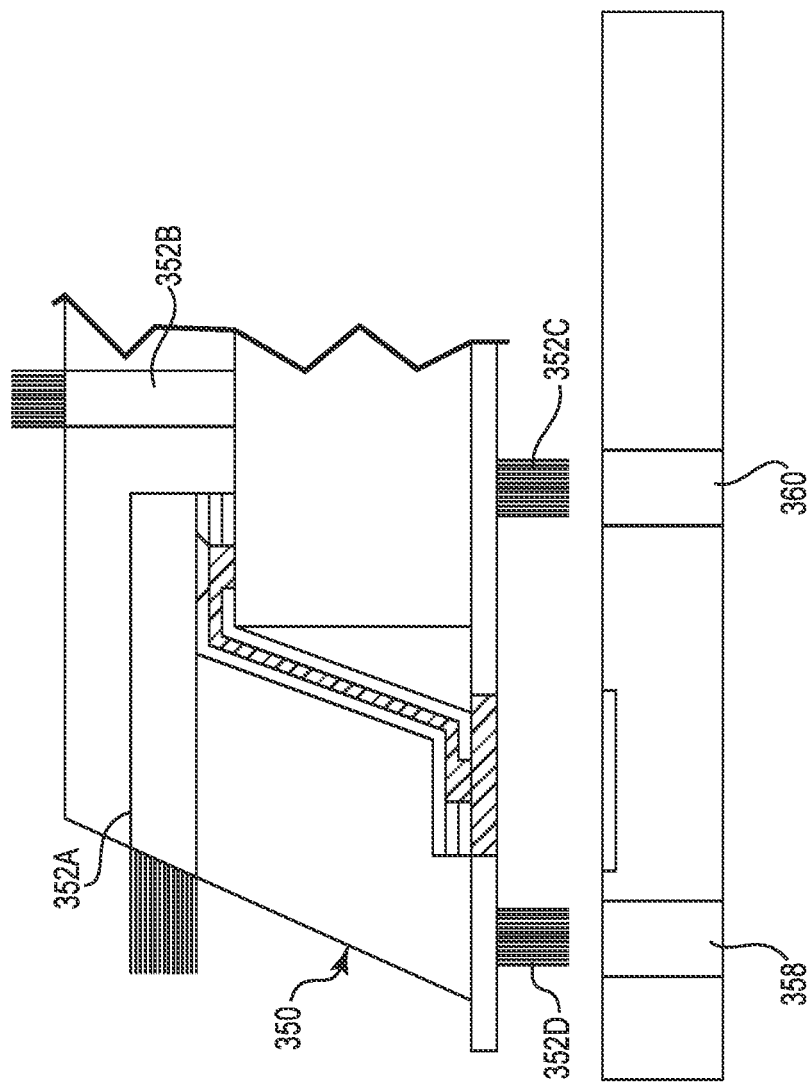

SIMULATED WIREBOND SEMICONDUCTOR PACKAGE

CROSS-REFERENCE TO RELATED APPLICATIONS

This application is a national stage application under 35 U.S.C. §371 of International Application No. PCT/US2010/037619, titled SIMULATED WIREBOND SEMICONDUCTOR PACKAGE, filed Jun. 7, 2010, which claims priority to U.S. Provisional Application No. 61/187,506, filed Jun. 16, 2009, both of which are hereby incorporated by reference in their entireties.

TECHNICAL FIELD

The present disclosure leverages the capabilities of the additive printing process to create a high performance electrical interconnect between integrated circuits and semiconductor packages. The printing process provides unique opportunity to add function or performance enhancement within the package structure not seen in traditional packages.

BACKGROUND OF THE INVENTION

Traditional semiconductors and IC devices are typically packaged in a variety of ways to provide redistribution from the terminals on the die to a spacing that is conducive to cost effective printed circuit board ("PCB") fabrication techniques. In many cases, the size and distance between die terminals is so small that the device cannot be connected to the final PCB without some sort of fan out or routing. The packages also serve to protect the fragile silicon or provide additional functions such as thermal management or near device decoupling. In many cases, the size and distance between die terminals is so small that the IC device cannot be connected to the final PCB without some sort of re-routing interface.

Most IC devices are produced with terminals in either a peripheral pattern that runs along the edges of the IC device or an area array pattern that spans across the surface of the IC device. Devices with the terminals along the edge are typically connected to the package by a method called wirebonding, where a very fine wire is bonded to the terminal and strung in a controlled manner to the corresponding package lead.

After all the terminals are connected, the package is typically overmolded with a plastic material to protect the wirebonds and keep them from dislodging or shorting to each other. In most cases, the connection of the IC device to the package is generally not reworkable once packaged and if there is a missing or broken connection it is difficult to repair.

The terminals on the package are generally transitioned to the PCB in two main ways. The first version includes a metal leadframe with formed metal leads extend from the package in what is called a gullwing shape. The leads are placed into solder which is reflowed to provide the final connection to the PCB. In the second version, the formed leads are left off the package which is often called a no lead configuration. This version is constructed with a trace or pad that is soldered directly to the corresponding pad on the PCB using solder paste which is reflowed.

Both methods have benefits and limitations. The leadframe style packages have been in use for many years, and have a low cost due to the established infrastructure. One of the big benefits of this style is the formed metal leads act as a flexible member that helps to decouple the stress induced when the PCB and the package expand and contract during thermal cycles as well as during a shock event. This stress decoupling adds to the reliability of the interconnect. The metal leadframe approach, however, is primarily used for relatively low pin count applications. The leads and wirebonds also have a relatively high inductance which can degrade electrical performance.

The no lead package approach has been very popular in recent years for wireless and power applications. The elimination of the formed metal lead extending from the package reduces cost and improves electrical performance by eliminating the leads. One limitation of the no lead types of packages is the lack of compliance at the terminal when soldered to the PCB. The solder reflowed to join the pad on the package to the pad on the PCB can see significant stress during thermal cycling or physical shock such as dropping a cell phone.

There also have been advancements in recent years in both package types where multiple IC devices are placed in the same package, creating what has been nicknamed SiP or "system in package". Placing multiple IC devices in a single package further complicates the problems discussed above.

BRIEF SUMMARY OF THE INVENTION

The present disclosure relates to the use of additive printing processes to create polymer-based metallic contacts that replace conventional wirebonds with simulated wirebonds to provide a low-cost, high-performance package. The printing process provides unique opportunity to add function or performance enhancement within the package structure not seen in traditional packages. The present semiconductor package can be used with single or multiple IC devices.

The present simulated wirebond semiconductor package resembles a traditional package in construction, but utilizes additive printing processes rather than conventional subtractive processes. The unique nature of the additive printing processes allows for a direct writing of circuitry and dielectrics, with the added benefit of stress decoupling at the terminal joints as well as embedded function not seen in traditional packaging. The present semiconductor package combines the electrical performance of the no lead with the compliance of the leadframe approach.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

One embodiment is directed to a semiconductor package with simulated wirebonds. A substrate is provided with a plurality of first pads on a first surface and a plurality of second pads on a second surface. Each of the first pads are electrically coupled to one or more of the second pads. At least one semiconductor device is located proximate the first surface of a substrate. The simulated wirebonds include at least a first dielectric layer selectively printed to create a plurality of recesses, and a conductive material located in the recesses to form first and second contact pads, and electrical traces electrically coupling the first and second contact pads. The first contact pads are electrically coupled to terminals on the semiconductor device and the second contact pads are electrically coupled to the first pads on the first surface of the substrate. An overmolding material seals the semiconductor device and the simulated wirebonds to the first surface of the substrate.

A plurality of dielectric layers preferably substantially surround the conductive traces. The conductive traces optionally include a circuit geometry that extends beyond electrically coupling the first and second contact pads. The conductive traces preferably have substantially rectangular cross-sectional shapes. Conductive plating is preferably applied to one or more of the circuit traces and the first and second contact pads. The conductive traces can be sintered conductive particles or a conductive ink.

In one embodiment, a compliant material is located between the second contact pads and the overmolding material. In another embodiment, at least one electrical device is printed on one of the dielectric layers and electrically coupled to at least one of the conductive traces. In another embodiment, the pads extend above the second surface of the substrate.

The present disclosure is also directed to a semiconductor package with a plurality of semiconductor devices located proximate the first surface of the substrate. Circuit geometry printed in dielectric layers electrically couples terminals on at least two semiconductor devices. In another embodiment, the plurality of semiconductor devices are arranged in a stacked configuration proximate the first surface of the substrate. A plurality of simulated wirebonds electrically couple the terminals on the semiconductor devices to pads on the first surface of the substrate.

The conductive traces can be arranged in a stacked configuration with tiered or staggered first contact pads. The simulated wirebonds optionally include one or more of optical fibers, printed optical material, coaxial conductors, radio-frequency circuits, shielding, or antennae. Optical structures in the simulated wirebonds can be optically coupled to the semiconductor device.

The present disclosure is also directed to an electrical assembly including the present semiconductor package and a circuit member with a plurality of contact pads electrically coupled to the pads on the second surface of the substrate. The circuit member can be selected from one of a dielectric layer, a printed circuit board, a flexible circuit, a bare die device, an integrated circuit device, organic or inorganic substrates, or a rigid circuit.

The present disclosure is also directed to a method of making a semiconductor package. A semiconductor device is located proximate a first surface of a substrate. At least a first dielectric layer is printed with a plurality of recesses. Conductive material is located in the recesses to form first and second contact pads, and electrical traces electrically coupling the first and second contact pads. The first contact pads are electrically coupled to terminals on the semiconductor device, and the second contact pads are electrically coupled to pads on the first surface of the substrate. The semiconductor device and the simulated wirebonds are then overmolded to the first surface of the substrate.

In one embodiment, pre-formed conductive trace materials are located in the recesses. The recesses are than plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

The present disclosure is also directed to several additive processes that combine the mechanical or structural properties of a polymer material, while adding metal materials in an unconventional fashion, to create electrical paths that are refined to provide electrical performance improvements. By adding or arranging metallic particles, conductive inks, plating, or portions of traditional alloys, the compliant printed semiconductor package reduces parasitic electrical effects and impedance mismatch, potentially increasing the current carrying capacity.

The printing process permits the fabrication of functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The printing process is typically followed by a thermal treatment, such as in a furnace or with a laser, to achieve dense functionalized structures.

The semiconductor package can be configured with conductive traces that reduce or redistribute the terminal pitch, without the addition of an interposer or daughter substrate. Grounding schemes, shielding, electrical devices, and power planes can be added to the semiconductor package, reducing the number of connections to the PCB and relieving routing constraints while increasing performance.

BRIEF DESCRIPTION OF THE SEVERAL VIEWS OF THE DRAWING

FIG. 1 is a cross-sectional view of a method of making a simulated wirebonds for a semiconductor package in accordance with an embodiment of the present disclosure.

FIG. 2 is a cross-sectional view of the simulated wirebonds of FIG. 1 with additional printed layers.

FIGS. 3 and 4 are arrays of simulated wirebonds formed on a flexible dielectric material in accordance with an embodiment of the present disclosure.

FIG. 18 is a cross-sectional view of a semiconductor package with simulated wirebonds having optical features in accordance with an embodiment of the present disclosure.

DETAILED DESCRIPTION OF THE INVENTION

Figure 4:
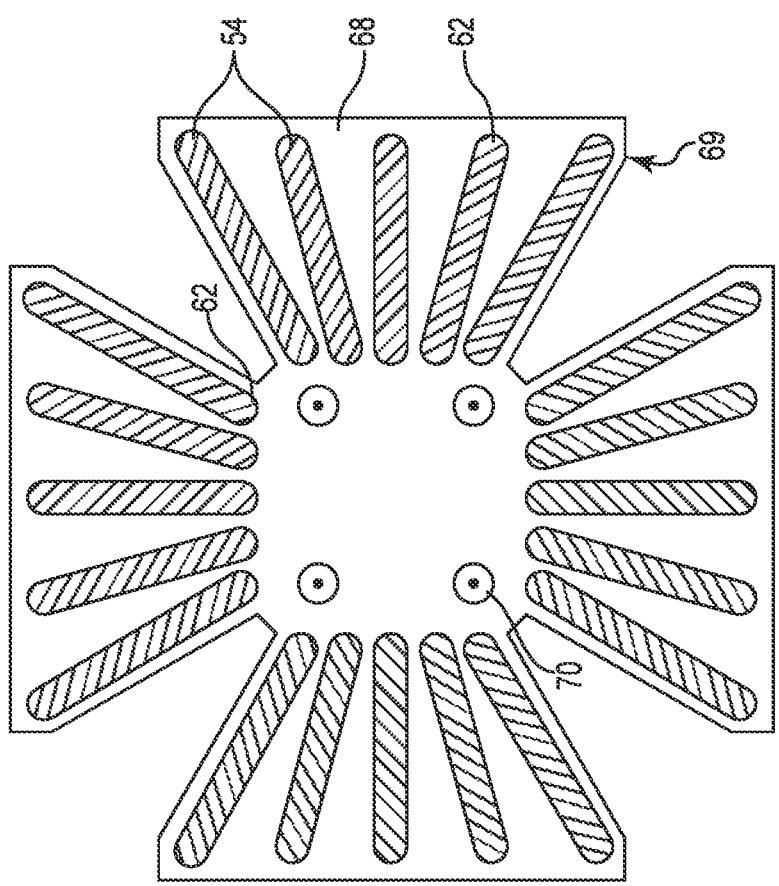

FIG. 1 is a side sectional view of substrate 50 with first layer 52A of a simulated wirebonds 54 for making a semiconductor package in accordance with an embodiment of the present disclosure. In the illustrated embodiment, the substrate 50 optionally includes pre-formed recesses 60A. The first layer 52A is preferably a dielectric material 56 selectively printed on surface 58 of the substrate 50 around recesses 60A.

As best illustrated in FIG. 2, recesses 60B in the dielectric material 56 and the recesses 60A are then metalized to create contact pads 62. Metalizing can be performed by printing conductive particles followed by a sintering step, by printing conductive inks, or a variety of other techniques. The metalizing material is preferably of copper or similar metallic materials such as phosphor bronze or beryllium-copper. The resulting contact pads 62 are optionally plated to improve conductive properties. The plating is preferably a corrosion resistant metallic material such as nickel, gold, silver, palladium, or multiple layers thereof.

Additional printed layers 52B, 52C (collectively "52") are sequentially printed on the first layer 52A. The layer 52B is printed to form recesses or trenches 60C that are subsequently metalized to create conductive trace 72 electrically coupling the contact pads 62 of the simulated wirebonds 54. The simulated wirebonds 54 are then removed from the substrate 50 for use in a semiconductor package, as discussed below.

The dielectric material may be constructed of any of a number of materials that provide electrostatic dissipation or to reduce cross-talk between adjacent conductive traces 72. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

In one embodiment, the contact pads 62 and the conductive traces 72 are formed by depositing a conductive material in a first state in the recesses 60A, 60B, 60C (collectively "60"), and then processed to create a second more permanent state. For example, the metallic powder is printed according to the circuit geometry and subsequently sintered, or the curable conductive material flows into the circuit geometry and is subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

The recesses 60C in the layer 52B permits control of the location, cross section, material content, and aspect ratio of the conductive traces 72. Maintaining the conductive traces 72 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses 60C to control the aspect ratio of the conductive traces 72 results in a more rectangular or square cross-section of the conductive traces 72 in the simulated wirebonds 54, with the corresponding improvement in signal integrity.

In another embodiment, pre-patterned or pre-etched thin conductive foil circuit traces are transferred to the recesses 60. For example, a pressure sensitive adhesive can be used to retain the copper foil circuit traces in the recesses 60. The trapezoidal cross-sections of the pre-formed conductive foil traces are then post-plated. The plating material fills the open spaces in the recesses 60 not occupied by the foil circuit geometry, resulting in a substantially rectangular or square cross-sectional shape corresponding to the shape of the recesses 60.

In another embodiment, a thin conductive foil is pressed into the recesses 60, and the edges of the recesses 60 act to cut or shear the conductive foil. The process locates a portion of the conductive foil in the trenches 60, but leaves the negative pattern of the conductive foil not wanted outside and above the trenches 60 for easy removal. Again, the foil in the trenches 60 is preferably post plated to add material to increase the thickness of the conductive traces 72 and to fill any voids left between the conductive foil and the recesses 60.

FIGS. 3 and 4 illustrate flexible dielectric sheets 68 containing various arrays 69 of simulated wirebonds 54 in accordance with an embodiment of the present disclosure. The dielectric sheet 68 can be printed or pre-formed. The present arrays 69 of simulated wirebonds 54 can be arranged in almost any geometry, such as for example in-line, staggered, or offset bond configurations.

The arrays 69 of simulated wirebonds 54 in FIGS. 3 and 4 permit precise control of the spacing and location of the various contact pads 62. Consequently, a plurality of contact pads 62 can be positioned relative to terminals on an integrated circuit device and simultaneously bonded to the terminals. Similarly, a plurality of contact pads 62 can be simultaneously bonded to pads on a substrate. In one embodiment, alignment marks 70 are printed on the dielectric sheet 68 to facilitate automatic positioning of the arrays 69 relative to an integrated circuit device using machine vision systems, and the like.

Figure 5:
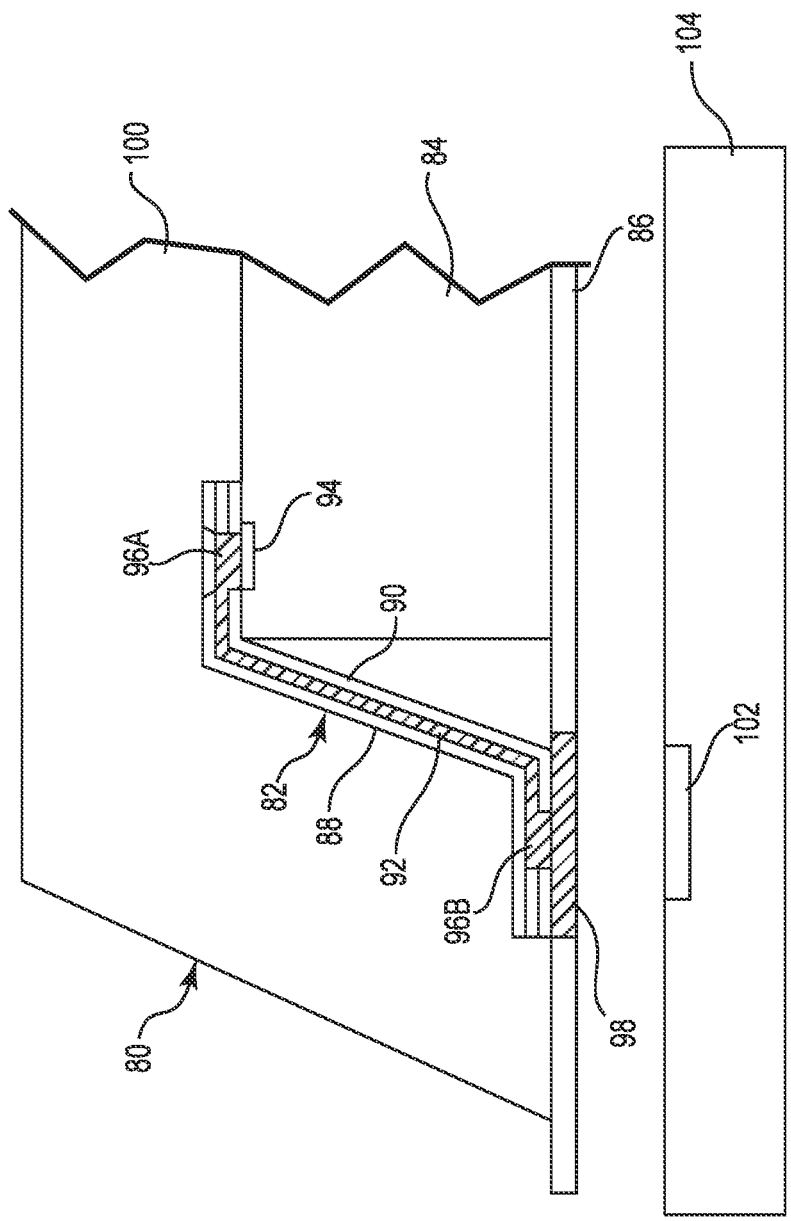
FIG. 5 is a cross-sectional view of a semiconductor package with a simulated wirebonds in accordance with an embodiment of the present disclosure.

FIG. 5 illustrates an embodiment of semiconductor package 80 with simulated wirebonds 82 in accordance with an embodiment of the present invention. Semiconductor device 84 is located on substrate 86. The configuration of FIG. 5 replicates a traditional no lead package, using the additive printing process to create an array of simulated wirebonds 82. As used herein, "simulated wirebond" refers to a conductive traces printed on a dielectric material.

In the illustrated embodiment, wirebonds 82 include top and bottom dielectric layers 88, 90 that shield conductive trace 92. Terminals 94 on the semiconductor device 84 is electrically coupled to contact pad 96A on simulated wirebonds 82. Contact pad 96B is electrically coupled to pad 98 on substrate 86. The simulated wirebonds 82 are preferably flexible.

Overmolding material 100 is then applied to the semiconductor device 84 and the wirebonds 82 similar to conventional IC device packaging. The exposed pad 98 can then be electrically coupled to contact pad 102 on circuit member 104. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

Figure 6:
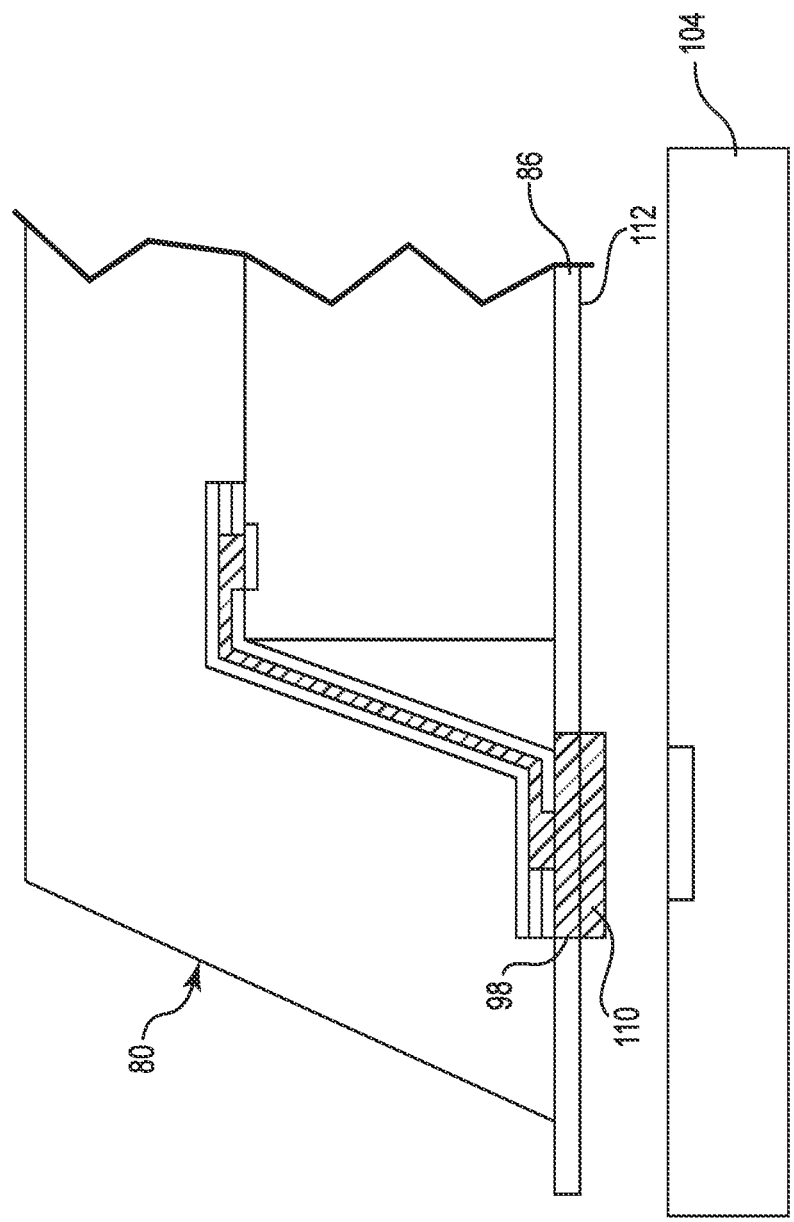
FIG. 6 is a cross-sectional view of a semiconductor package with an extended pad in accordance with an embodiment of the present disclosure.

FIG. 6 illustrates an alternate semiconductor package 80 in which exposed pad 98 is metalized to create extended portion 110 located above bottom surface 112 of the substrate 86. The extended portion 110 provides a stand-off that allows for flux cleaning after reflow of solder used to bond pad 98 to circuit member 104.

Figure 7:
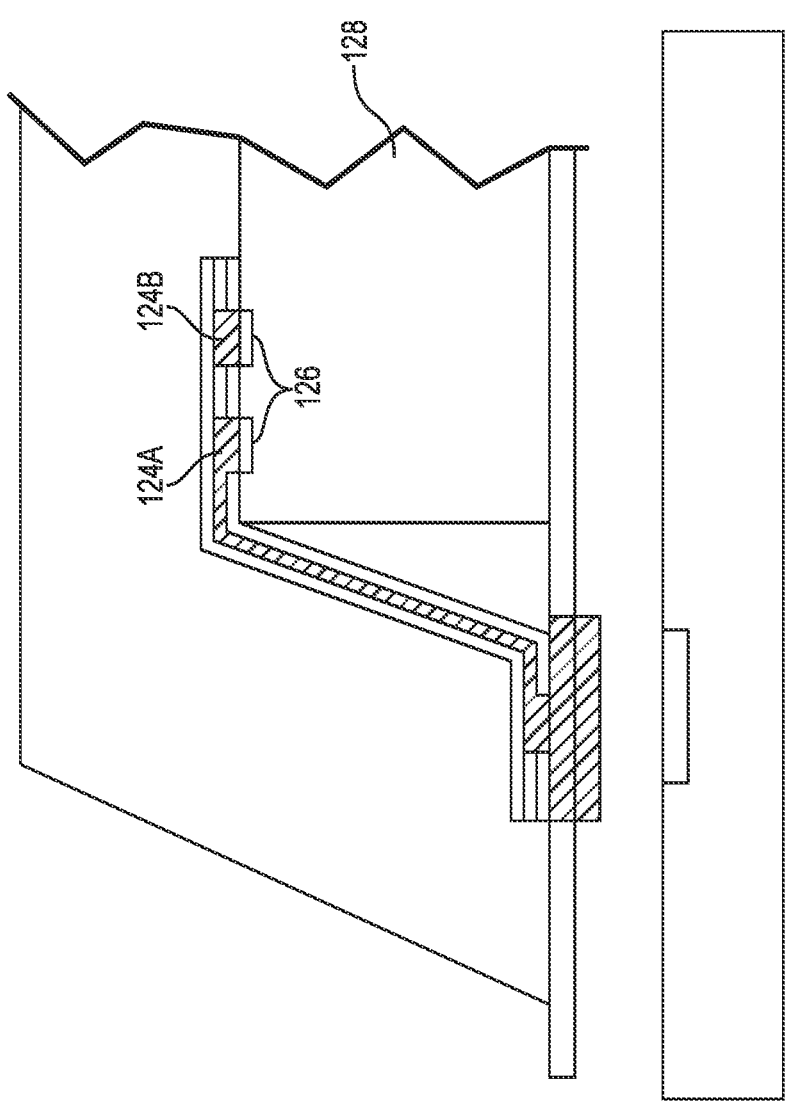
FIG. 7 is a cross-sectional view of a semiconductor package with tiered or staggered simulated wirebonds in accordance with an embodiment of the present disclosure.

FIG. 7 illustrates semiconductor package 120 with simulated wirebonds 122 having staggered or tiered contact pads 124A, 124B (collectively "124") in accordance with an embodiment of the present disclosure. The contact pads 124 permit increased density of terminals 126 on semiconductor device 128. The size and pitch of contact pads 124 with a contact-to-contact spacing (pitch) on the order of less than 1.0 mm pitch, and more preferably a pitch of less than about 0.7 millimeter, and most preferably a pitch of less than about 0.4 millimeter.

Figure 8:
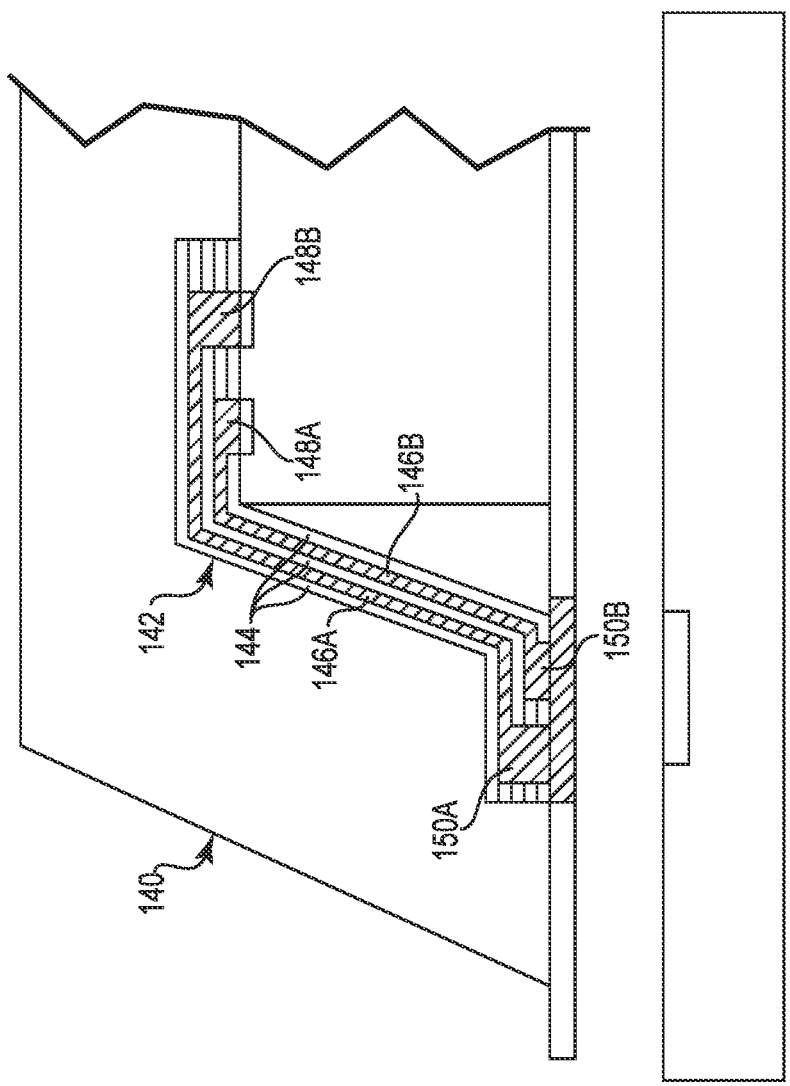
FIG. 8 is a cross-sectional view of a semiconductor package with a stacked simulated wirebonds in accordance with an embodiment of the present disclosure.

FIG. 8 illustrates another semiconductor package 140 with a stacked or tiered 142 in accordance with an embodiment of the present disclosure. The multilayered wirebonds 142 preferably include alternating layers of dielectric material 144 and conductive traces 146A, 146B coupling contact pads 148A, 148B to contact pads 150A, 150B, respectively.

Figure 9:
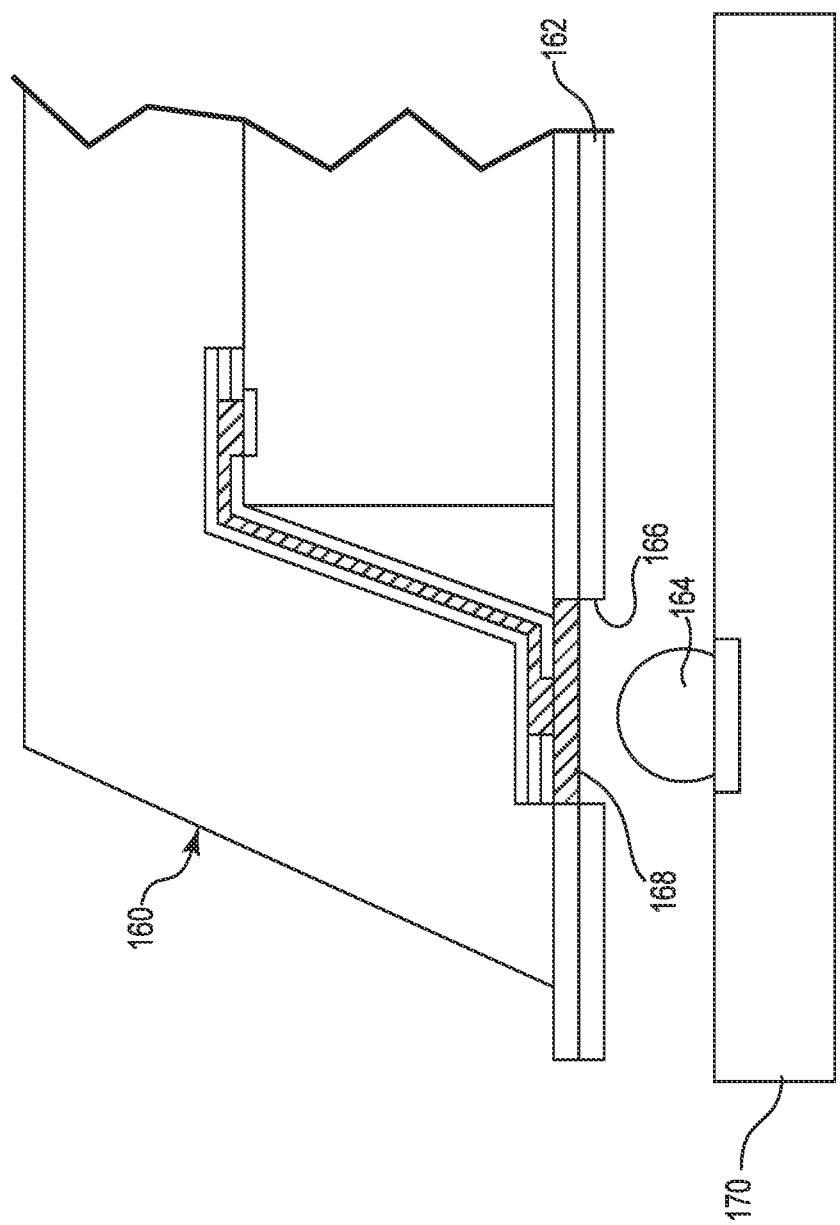
FIG. 9 is a cross-sectional view of a semiconductor package with a recessed contact pad in accordance with an embodiment of the present disclosure.

FIG. 9 illustrates semiconductor package 160 printed with bonding agent or pre-applied under fill 162 that engages circuit member 170 when solder 164 is reflowed. Layer 162 creates recess 166 aligned with pad 168 into which solder 164 flows.

Figure 10:
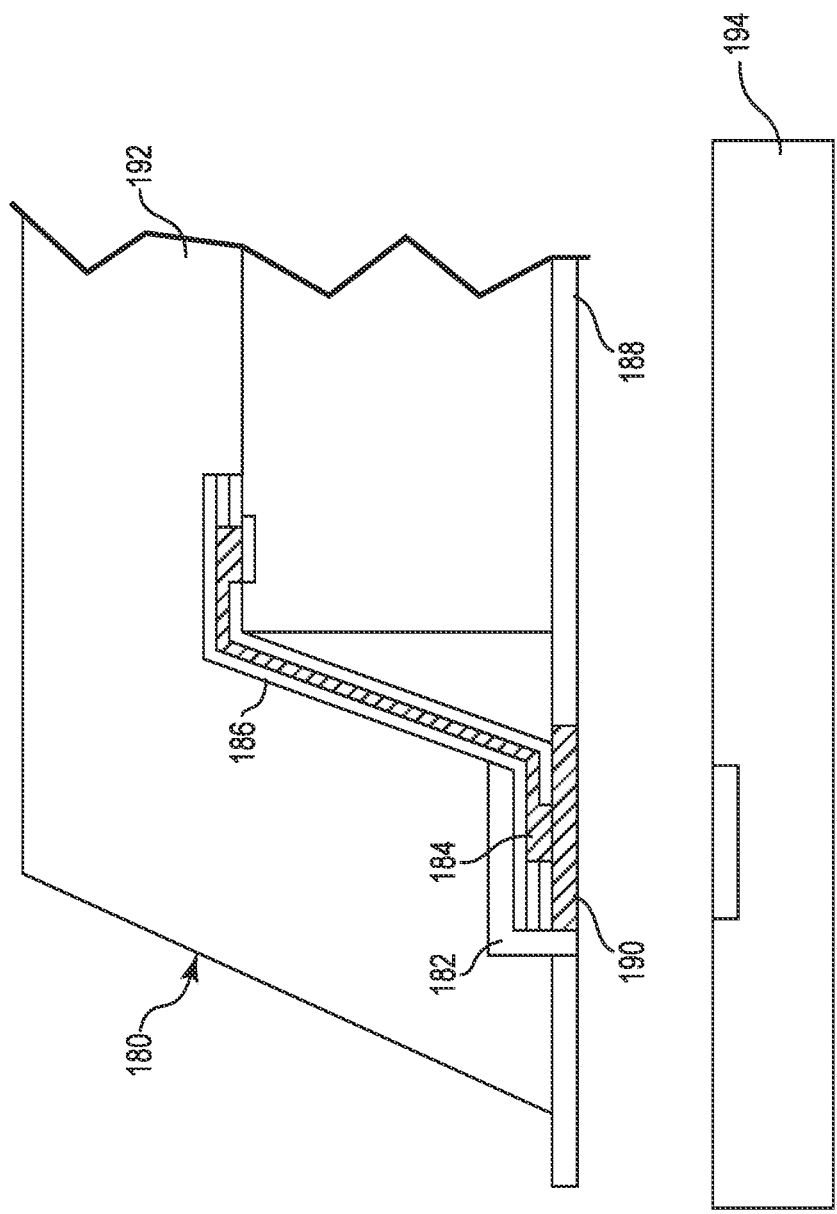
FIG. 10 is a cross-sectional view of a semiconductor package with a compliant layer located between a contact pad and the overmolding material in accordance with an embodiment of the present disclosure.

FIG. 10 illustrates semiconductor package 180 with a compliant layer 182 located adjacent to contact pad 184 on simulated wirebonds 186 in accordance with an embodiment of the present disclosure. Compliant layer 182 is preferably printed at the metallization of contact pad 184 to provide stress relief at the joint. In the illustrated embodiment, the compliant layer 182 extends through the substrate 188 to permit flexure of the pad 190 relative to the overmolding 192. The compliant layer 182 permits the contact pad 190 to move in at least two degrees of freedom to facilitate electrical coupling with circuit member 194.

Figure 11:
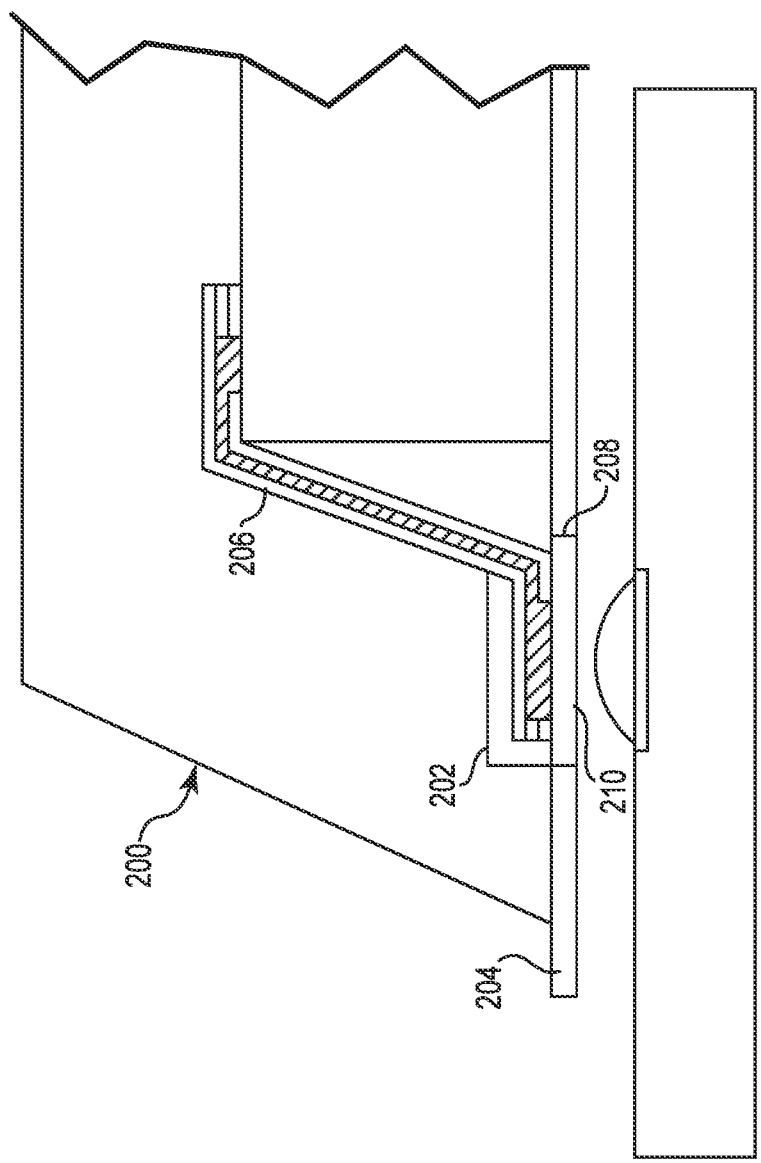
FIG. 11 is a cross-sectional view of a semiconductor package with an alternate compliant layer in accordance with an embodiment of the present disclosure.

FIG. 11 illustrates an alternate semiconductor package 200 with compliant layer 202 that does not extend through substrate 204 in accordance with an embodiment of the present disclosure. Portion 210 of simulated wirebonds 206 are configured to mate with recesses 208 in the substrate 204, inherently creating a solder mask definition.

Figure 12:
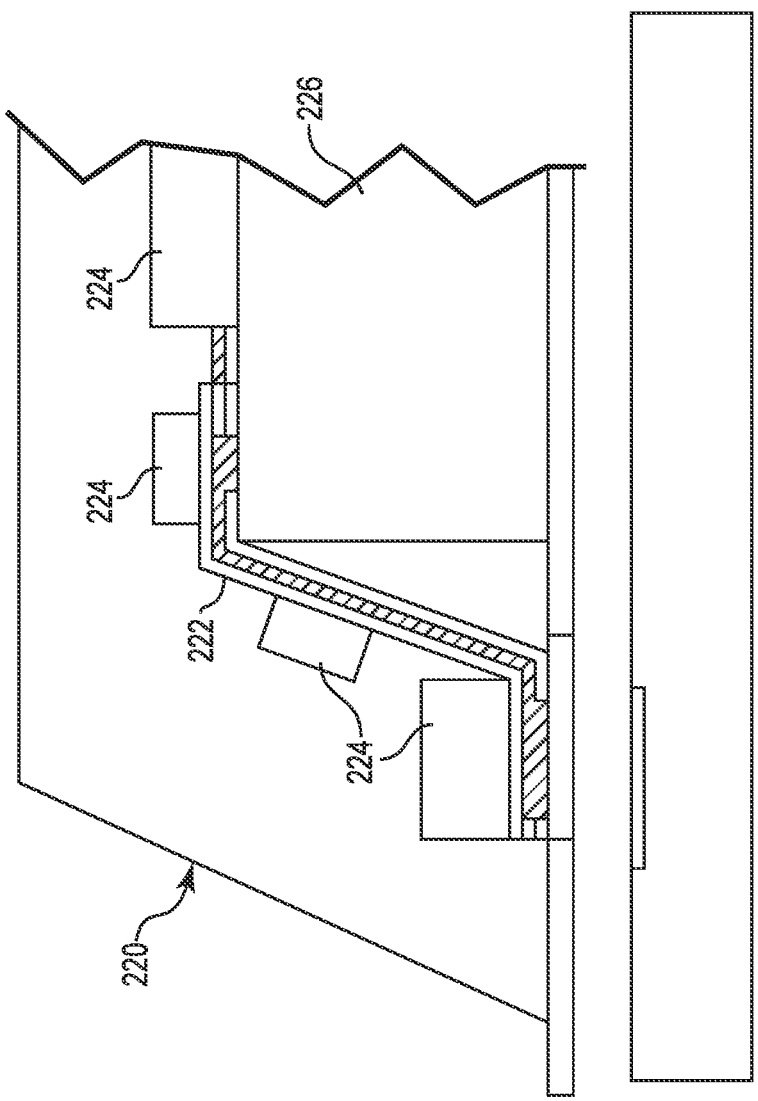
FIG. 12 is a cross-sectional view of a semiconductor package with printed electrical devices electrically coupled to the simulated wirebonds in accordance with an embodiment of the present disclosure.

FIG. 12 illustrates an alternate semiconductor package 220 with simulated wirebonds 222 that include electrical devices 224. The capability of the additive printing process allows for printed internal function to be added to the simulated wirebonds 222. Additional electrical devices 224 can be printed onto the semiconductor device 226.

The electrical devices 224 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. The electrical devices 224 are preferably printed during construction of the simulated wirebonds 222. The electrical devices 224 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 224 can be formed using printing technology, adding intelligence to the semiconductor package 220. Features that are typically located on the IC device 226 can be incorporated into the semiconductor package 220 in accordance with an embodiment of the present disclosure.

The availability of printable silicon inks provides the ability to print electrical devices 224, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 224 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

In one embodiment, a plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a substrate, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 13:
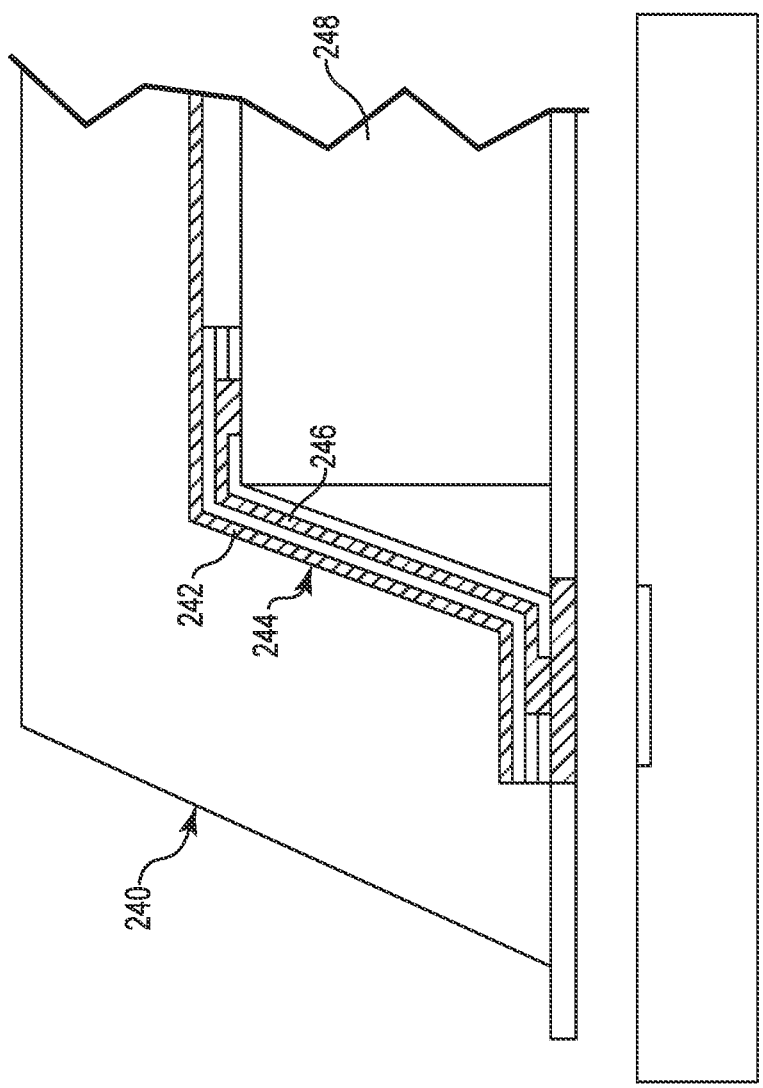
FIG. 13 is a cross-sectional view of a semiconductor package with an RF antenna printed on the simulated wirebonds in accordance with an embodiment of the present disclosure.

FIG. 13 illustrates semiconductor package 240 with RF shielding or antennae 242 incorporated into simulated wirebonds 244 in accordance with an embodiment of the present disclosure. The RF shielding or antennae 242 is preferably printed during construction of the simulated wirebonds 244. RF shielding 242 is added to reduce cross talk or signal interference between adjacent conductive traces 246. RF antennae 242 facilitates chip-to-chip or chip-to-system communication. The simulate wirebonds 244 can be configured in a micro-strip or strip line configurations to create a high performance connection not possible with traditional wirebonds.

Figure 14:
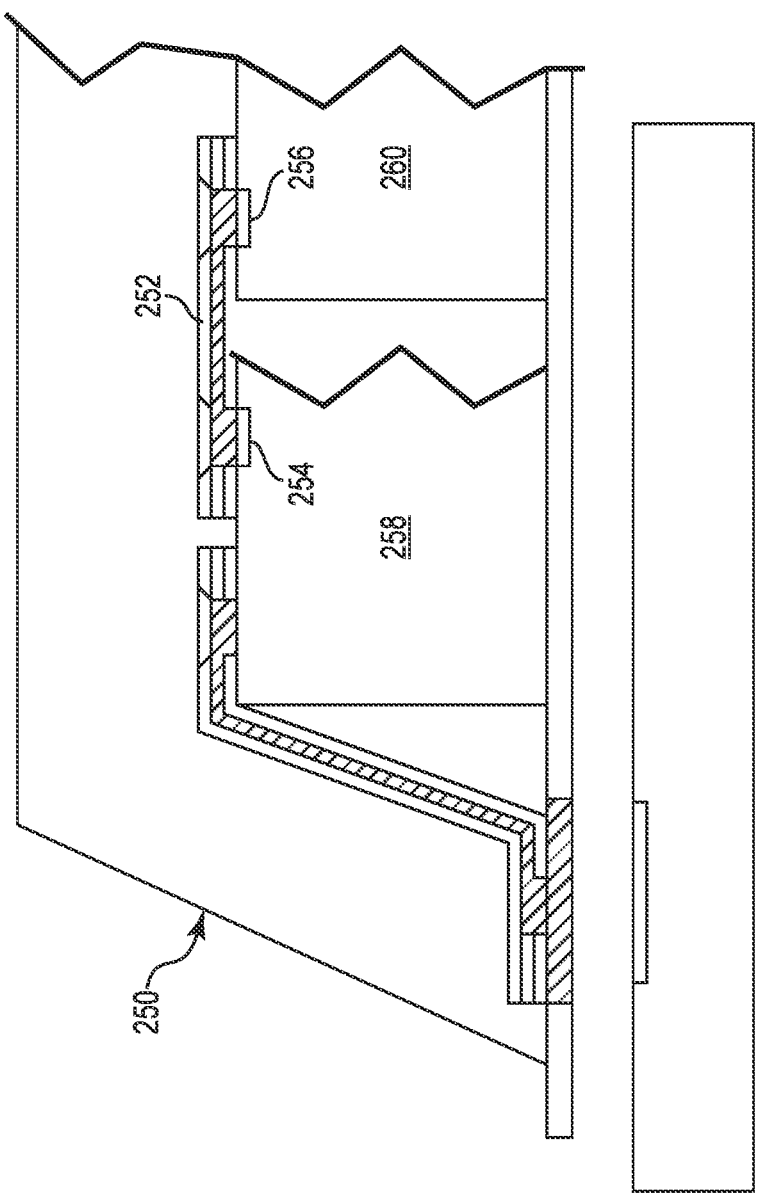
FIG. 14 is a cross-sectional view of a multi-chip semiconductor package with a simulated wirebonds in accordance with an embodiment of the present disclosure.

FIG. 14 illustrates multi-chip semiconductor package 250 in accordance with an embodiment of the present disclosure. The wirebonds structure 252 can be used to interconnect terminals 254, 256 on adjacent semiconductor devices 258, 260.

Figure 15:
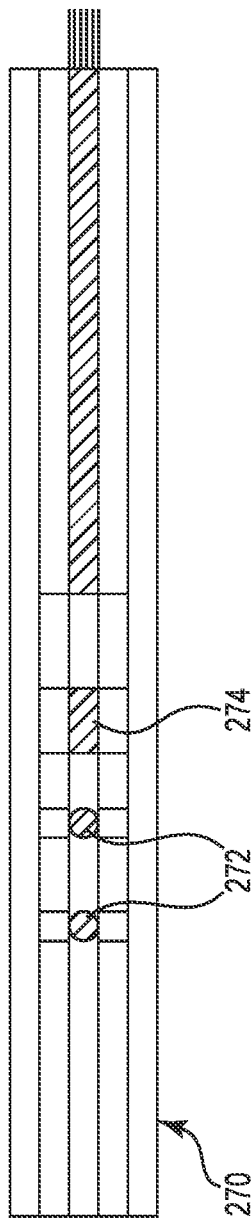
FIG. 15 is a cross-sectional view of a simulated wirebonds with optical features in accordance with an embodiment of the present disclosure.

FIG. 15 illustrates an alternate simulated wirebonds 270 with embedded optical fiber 272 or printed optical quality material 274 in accordance with an embodiment of the present disclosure. The printing process may allow for in-situ deposition of coatings that enhance the optical transmission, provide directional changes not possible with traditional fiber, and reduce optical losses. The precision of the printing process can also assist with resolving misalignment issues when the optical interconnect transitions to another chip within the package, another package in the system, or system to system integration.

Figure 16:
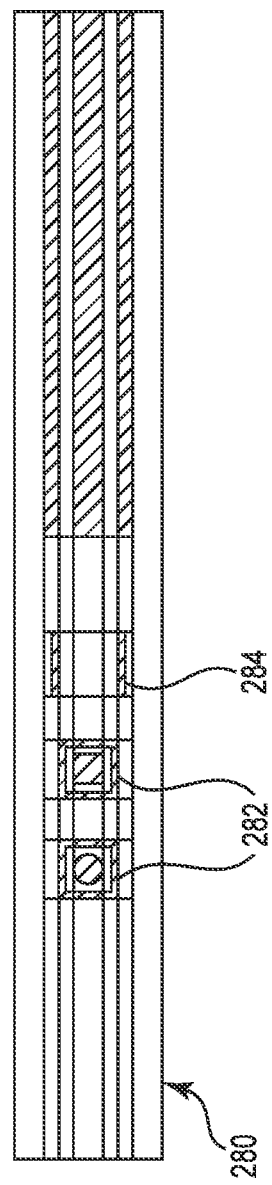
FIG. 16 is a cross-sectional view of a simulated wirebonds with alternate optical features in accordance with an embodiment of the present disclosure.

FIG. 16 illustrates an alternate simulated wirebonds 280 with embedded coaxial structures 282, printed micro strip RF circuits with dielectric/metal layers 284. Compliant material can be added to one or more of the layers to support the structures 272, 274, 282, 284 to reduce thermal or flexure effects.

Figure 17:
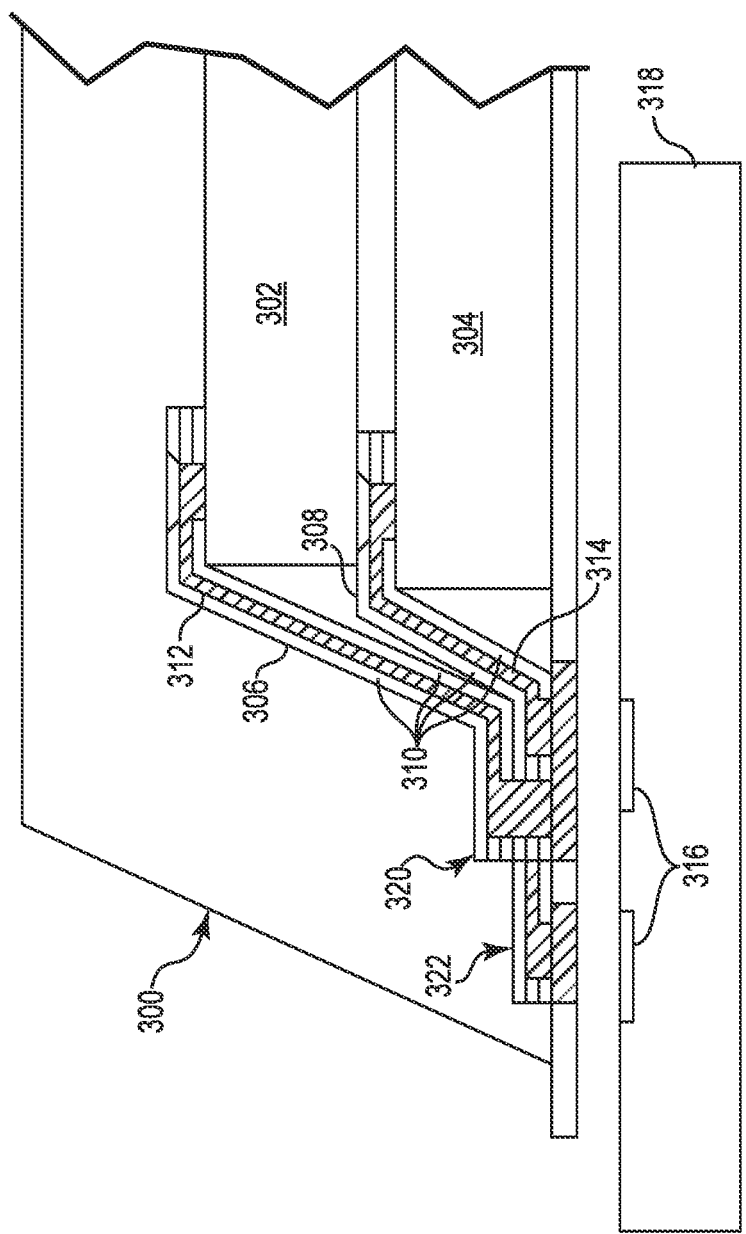
FIG. 17 is a cross-sectional view of a multi-chip semiconductor package with simulated wirebonds in accordance with an embodiment of the present disclosure.

FIG. 17 illustrates a multi-chip semiconductor package 300 (also referred to as a system-in-package) with a plurality of stacked semiconductor devices 302, 304 in accordance with an embodiment of the present disclosure. Simulated wirebonds 306, 308 include dielectric layers 310 that insulate the conductive traces 312, 314 to prevent shorting, and shielding to reduce cross-talk. The multiple simulated wirebonds 306, 308 can be terminated to the same pad 316, separate pads, or one structure 320 can be terminated to another 322, which then terminates to the outside to facilitate coupling with another circuit member 318.

FIG. 18 illustrates a semiconductor package 350 with simulated wire bonds 352A, 352B, 252C, 352D (collectively "352") that include optical coupling. The optical couplings can be chip-to-chip (such as in a multi-chip semiconductor package), package-to-package, package-to-circuit member 354, or package to system. In the illustrated embodiment, circuit member 356 includes optical connectors 358, 360 adapted to optically couple with simulated wire bonds 352D, 352C, respectively.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either or both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A semiconductor package comprising:
a substrate comprising a plurality of first pads on a first surface and a plurality of second pads on a second surface, each of the first pads electrically coupled to one or more of the second pads;
at least one semiconductor device comprising a first surface located proximate the first surface of a substrate and a second surface with terminals oriented to face away from the first surface of the substrate;
at least one simulated wirebond comprising at least a first dielectric layer selectively printed to create a plurality of recesses, and a conductive material located in the recesses to form first wirebond contact pads and second wirebond contact pads, and conductive traces electrically coupling the first and second wirebond contact pads, the conductive traces formed in the recesses comprise a generally rectangular cross-sectional shape, the first wirebond contact pads electrically coupled to the terminals on the semiconductor device and the second wirebond contact pads electrically coupled to the first pads on the first surface of the substrate so the simulated wirebond extends from the first surface of the substrate to the second surface of the semiconductor device; and
overmolding material sealing the semiconductor device and the simulated wirebonds to the first surface of the substrate.

2. The semiconductor package of claim 1 wherein the at least first dielectric layer comprises a plurality of dielectric layers substantially surrounding the conductive traces.

3. The semiconductor package of claim 1 wherein the conductive traces comprise a circuit geometry that extends beyond electrically coupling the first and second wirebond contact pads.

4. The semiconductor package of claim 1 wherein conductive traces comprise substantially rectangular cross-sectional shapes.

5. The semiconductor package of claim 1 wherein the conductive traces comprises a conductive plating deposited in a plurality of the recesses.

6. The semiconductor package of claim 1 comprising a compliant material located between the second wirebond contact pads on the simulated wirebond and the overmolding material.

7. The semiconductor package of claim 1 comprising at least one electrical device printed on one of the dielectric layers and electrically coupled to at least one of the conductive traces.

8. The semiconductor package of claim 1 comprising:
a plurality of semiconductor devices located proximate the first surface of the substrate; and
circuit geometry printed in dielectric layers electrically coupling terminals on at least two semiconductor devices.

9. The semiconductor package of claim 1 comprising:
a plurality of semiconductor devices located proximate the first surface of the substrate; and
a plurality of simulated wirebonds electrically coupling terminals on the semiconductor devices to pads on the first surface of the substrate.

10. The semiconductor package of claim 1 comprising:
a plurality of semiconductor devices arranged in a stacked configuration proximate the first surface of the substrate; and
a plurality of simulated wirebonds electrically coupling terminals on the semiconductor devices to pads on the first surface of the substrate.

11. The semiconductor package of claim 1 wherein the conductive traces comprise a stacked configuration with tiered or staggered first wirebond contact pads.

12. The semiconductor package of claim 1 wherein the simulated wirebond includes one or more of optical fibers, printed optical material, coaxial conductors, radio-frequency circuits, shielding, or antennae.

13. An electrical assembly comprising:
the semiconductor package of claim 1; and
a circuit member with a plurality of contact pads electrically coupled to the pads on the second surface of the substrate.

14. The semiconductor package of claim 1 wherein the simulated wirebond extends beyond the semiconductor package.

15. The semiconductor package of claim 1 wherein the simulated wirebond extends beyond the terminals on the semiconductor device and the conductive traces are accessible from outside the semiconductor package.

16. The semiconductor package of claim 1 comprising optical material located in a plurality of recesses in the simulated wirebond, wherein the first wirebond contact pads optically couple to terminals on the semiconductor device and second wirebond contact pads optically couple to the substrate.

17. The semiconductor package of claim 1 wherein at least the first dielectric layer comprises a flexible material.

18. The semiconductor package of claim 1 wherein the first surface of the semiconductor device is adjacent the first surface of the substrate.

19. The semiconductor package of claim 1 wherein the second surface of the semiconductor device is generally parallel to, and offset from, the first surface of the substrate.

20. The semiconductor package of claim 1 wherein a portion of the simulated wirebond that extends from the first surface of the substrate to the second surface of the semiconductor device is unattached to either the substrate or the semiconductor device.

* * * * *